United States Patent [19]

Jin et al.

[11] Patent Number: 4,923,739
[45] Date of Patent: May 8, 1990

[54] COMPOSITE ELECTRICAL INTERCONNECTION MEDIUM COMPRISING A CONDUCTIVE NETWORK, AND ARTICLE, ASSEMBLY, AND METHOD

[75] Inventors: Sungho Jin, Millington; William R. Lambert, Mendham; Robert C. Moore, Lawrenceville; John J. Mottine, Jr., West Keansburg; Richard C. Sherwood, New Providence; Thomas H. Tiefel, Piscataway, all of N.J.

[73] Assignee: American Telephone and Telegraph Company, New York, N.Y.

[21] Appl. No.: 79,374

[22] Filed: Jul. 30, 1987

[51] Int. Cl.$^5$ .............................. H01R 9/09
[52] U.S. Cl. ............................ 428/221; 29/832; 174/117 A; 174/117 FF; 361/411; 428/323; 428/402; 428/900; 439/65; 439/86
[58] Field of Search .................. 361/411; 29/832; 174/117 FF, 112 A; 439/65, 86; 428/323, 900, 221, 402, 209

[56] References Cited

U.S. PATENT DOCUMENTS

| | | | |
|---|---|---|---|
| 3,359,145 | 12/1987 | Salyer et al. | 428/900 |
| 3,762,946 | 10/1973 | Stow et al. | 174/117 A |
| 4,427,481 | 1/1984 | Smith et al. | 428/900 |
| 4,447,492 | 5/1984 | McKaveney | 428/900 |
| 4,448,837 | 5/1984 | Ikeda et al. | 428/900 |
| 4,546,037 | 10/1985 | King | 408/900 |
| 4,548,862 | 10/1985 | Hartman | 428/323 |
| 4,554,033 | 11/1985 | Decy et al. | 428/900 |
| 4,737,112 | 4/1988 | Jin et al. | 428/900 |

OTHER PUBLICATIONS

"Influence of Particle Size on the Electrical Resistivity of Compacted Mixtures of Polymeric and Metallic Powders", *Journal of Applied Physics*, vol. 42, No. 2, Feb. 1971, pp. 614-618, by A. Malliaris et al.

*Primary Examiner*—Marion C. McCamish
*Attorney, Agent, or Firm*—Peter A. Businger

[57] ABSTRACT

An electrical interconnection medium is made as a composite of electrically conducting, magnetic particles in a nonconductive matrix material. Particles are magnetically aligned into a network which extends in at least two dimensions as, e.g., in a sheet or layer medium. A layer medium may further include additional, larger conductive particles which may be magnetically aligned into columns extending the thickness of the medium; typically, in this case, the medium serves as an anisotropically conductive medium in the direction of the columns, with slight in-plane conductivity imparted by the network aiding the dissipation of electrostatic charge.

15 Claims, 2 Drawing Sheets

COMPOSITE ELECTRICAL INTERCONNECTION MEDIUM COMPRISING A CONDUCTIVE NETWORK, AND ARTICLE, ASSEMBLY, AND METHOD

TECHNICAL FIELD

The invention is concerned with electrical interconnection media and their manufacture, and with articles and assemblies comprising such media.

BACKGROUND OF THE INVENTION

With increasing miniaturization of electrical and electronic devices, and increasing packing density in combining devices into assemblies, there is growing commercial interest in means other than traditionally used soldering for making electrical interconnections. Prominent among such means are composite media in which electrically conducting particles are embedded in a nonconductive matrix material, such media forming, e.g., viscous, complaint, or hardened structures between components bearing contact pads.

Interconnection media may take a variety of forms and have been made having conductivity in one, two, or three mutually perpendicular directions. A particularly important category of interconnection media takes layer or sheet form, in which case it is customary to designate directions such that x- and y-directions lie in the plane of the sheet or layer. Some such interconnection media have z-direction conductivity only, others have z- and y-direction conductivity, and isotropically conductive media have x-, y-, and z-direction conductivity. For an instance of each of these cases see, respectively, U.S. Pat. No. 4,548,862, "Flexible Tape Having Bridges of Electrically Conductive Particles Extending Across Its Pressure-Sensitive Adhesive Layer", issued Oct. 22, 1985 to R. B. Hartman;

U.S. Pat. No. 4,546,037, "Flexible Tape Having Stripes of Electrically Conductive Particles for Making Multiple Connections", issued Oct. 8, 1985 to T. W. King et al.; and A. Malliaris et al., "Influence of Particle Size on the Electrical Resistivity of Compacted Mixtures and Polymeric and Metallic Powders", *Journal of Applied Physics*, Vol. 42 (1971), pp. 614–618.

In the following, particular attention is accorded to interconnection media having at least two directions of conductivity. With respect to such media, the invention is motivated in part by a desire for reducing the concentration of conductive particles in a composite medium so as to more nearly retain in the composite medium the mechanical properties of a matrix material.

SUMMARY OF THE INVENTION

An electrical interconnection medium is made to include a network of conductive magnetic particles in a nonconductive or at least not significantly conductive matrix material. Formation of the network involves magnetic-field processing, resulting in a desired level of conductivity at least in two preferred dimensions. In a preferred embodiment of the invention, the medium takes the form of a sheet or layer, and magnetic-field processing may involve the use of significant field components in x- and y-directions of the medium.

A layer medium in accordance with the invention may further comprise anisotropically conductive features such as, e.g., z-direction conductive single particles or magnetically aligned columns of conductive magnetic particles, and such features may in fact be the major conductive features of the medium. As a result, z-direction conductivity may be significantly greater than x-y conductivity. This aspect of the invention is considered as particularly useful for providing desired, slight x-y conductivity to an otherwise predominantly z-direction conductive interconnection medium, such x-y conductivity serving, e.g., to facilitate dissipation of electrostatic charge whose build-up otherwise may interfere with device operation.

BRIEF DESCRIPTION OF THE DRAWING

FIG. 4 is a schematic, x-z cross-sectional representation of an interconnection medium having strong z-direction conductivity as resulting primarily from z-direction aligned chains of magnetic, conductive particles, in combination with slight x-y conductivity as resulting from the presence of a network of magnetic, conductive particles in an essentially nonconductive matrix material;

FIG. 5 is a schematic, x-z cross-sectional representation of an interconnection medium which differs from the medium shown in FIG. 4 in that end particles of z-direction conductive chains protrude from top and bottom surfaces of the medium; and FIG. 6 is a schematic, x-z cross-sectional representation of apparatus in the form of a device assembly comprising an interconnection medium in accordance with FIG. 4 or FIG. 5.

DETAILED DESCRIPTION

Figure 1:
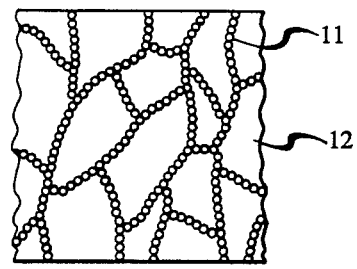
FIG. 1 is a schematic, x-y plane representation of an interconnection medium having x-y or x-y-z conductivity as resulting from a network of magnetic, conductive particles in an essentially nonconductive matrix material.
Figure 2:
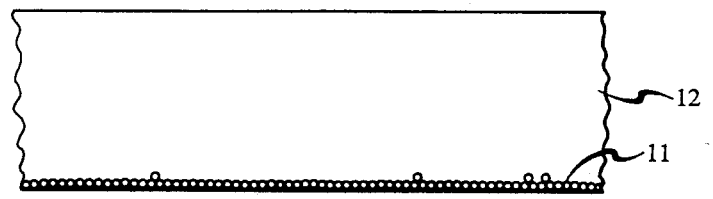
FIG. 2 is a schematic, x-z cross-sectional representation of an interconnection medium having x-y conductivity as resulting from a network of magnetic, conductive particles in an essentially nonconductive matrix material.
Figure 3:
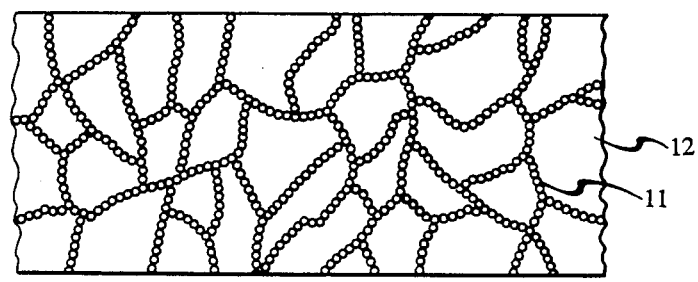
FIG. 3 is a schematic, x-z cross-sectional representation of an interconnection medium having x-y-z conductivity as resulting from a network of magnetic, conductive particles in an essentially nonconductive matrix material.

FIGS. 1, 2, and 3 show magnetic, conductive particles 11 in nonconductive matrix material 12. Conductivity of the resulting composite medium may be in x- and y-directions only (FIG. 1 in combination with FIG. 2); alternatively, conductivity may be in x-, y-, and z-direction (FIG. 1 in combination with FIG. 3).

FIG. 4 shows magnetic, conductive particles 11 and 21, and nonconductive matrix material 12. Particles 21 are aligned into z-direction conductive chains extending between top and bottom surfaces of an interconnection medium, and particles 11 form a network of particles which imparts slight isotropic conductivity to the medium.

FIG. 5 shows features as described above in connection with FIG. 4 and, as an additional preferred feature, end particles of chains protruding from surfaces for the sake of reduced z-direction contact resistance.

FIG. 6 shows a first device component 41 with electrical contact pads 411, 412, and 413, and two second device components 42 with electrical contact pads 421, 422, and 423. Disposed between first and second components are interconnection media 43 as described above in connection with FIGS. 4 and 5, providing for electrical interconnection between respective contact pads 411 and 421, 412 and 422, and 413 and 423. For example, component 41 may be a supporting substrate or circuit board, and components 42 a number of semiconductor or surface-mounted devices. Also, a component 42 may be a test head for testing circuitry on component 41, or component 41 may be a test head for testing circuitry on a component 42.

Among essentially nonconductive materials suitable as matrix material are nonconductive materials, weakly conductive materials, and semiconductor materials, and such materials may have elastomeric, adhesive, glassy, or ceramic properties. Among suitable materials are polymeric materials such as, e.g., silicone rubber, epoxies, and resins. Materials may be organic or inorganic.

Manufacture of interconnection media of the invention may be facilitated by the use of matrix materials which initially are in powder form, in the form of a slurry, or in solution. After addition of magnetic, conductive particles and magnetic field processing, a final medium may result, e.g., upon melting and solidifying, upon drying, or upon curing or other form of hardening. Hardening may be effected, e.g., by heating in a furnace or by inductive or microwave means; also, radiation-sensitive materials may be hardened upon exposure to suitable radiation.

Included particles may be conductive in bulk, or at least at their surface. Also, relevant particles at least in part are sufficiently magnetic to allow alignment by application of an external magnetic field. Among suitable particle materials are nickel, iron, cobalt; alloys containing nickel, iron, or cobalt; and ferrites. Also, conductive surface coatings may be used, and such coatings may further serve for surface protection; precious metals such as, e.g., silver, gold, and precious-metal alloys are particularly suitable in this respect. Further of interest, in some applications, is thermal conductivity of a composite medium, in which case particles may be preferred which include a copper layer which, in turn, may be coated with precious metal.

Preferred particle concentration in an interconnection medium of the invention is typically in a range from 0.5 to 30 percent by volume, and preferably in a range from 1 to 10 percent by volume, lower concentrations being preferred in the interest of maintaining desired properties such as, e.g., mechanical strength, adhesiveness, and durability. Particles may be spherical or approximately spherical in shape, and the use of particles in other forms such as, e.g., flakes and rods is not precluded. Preferred particle diameter is in a range from 0.5 to 10 micrometers and preferably from 1 to 5 micrometers.

Media of the invention may be made separate for later installation in interconnect assemblies; also, such media may be made insitu, e.g., on a component to be interconnected. Especially in the latter case a medium may be patterned, e.g., in the interest of the formation of preferred electrically conductive paths.

A common feature shared by embodiments of the invention is the presence of a network of conductive, magnetic particles in an essentially nonconductive matrix material, such network being formed as a result of magnetic field processing prior to hardening of the matrix material. Magnetic field processing involves exposure to fields having different directions and, optionally, different strengths; for example, fields may be in x- and y-directions, x- and z-directions, or x-, y-, and z-directions. (It has been found that, in a sheet medium, an x-y-conductive network can be obtained, e.g., by application of an x-direction field followed by a z-direction field - i.e., even without application of a y-direction field. While a resulting medium may have x-conductivity greater than y-conductivity, the latter typically is at least 25 percent of the former.)

As a medium having x-y or x-y-z conductivity, and as compared with, e.g., silver-filled epoxies, the invention permits the achievement of desired conductivity at essentially lowest-possible concentrations of conductive particles in a nonconductive matrix material. As a result, interconnection media of the invention have mechanical properties closely approximating those of the matrix material. As compared with media having randomly distributed particles, interconnection media of the invention typically have superior strength, compliance, and compressibility. A further advantage derives from the fact that, under suitable conditions of magnetic-field processing, media can be made to have essentially particle-free surface regions at one or both surfaces of a sheet medium—as may be desired, e.g., for z-direction insulating media. In either case, i.e., whether or not there is z-direction conductivity, a medium of the invention may serve as conductive ink or adhesive. In such applications, x-y resistivity and, optionally, z-direction resistivity are preferably less than 1 ohm-centimeter.

As described, a magnetically formed conductive network may impart x-y or x-y-z conductivity to an interconnection medium as may be desired, e.g., in interconnection circuitry as used on personal data cards and on polymer-based, multi-layer printed circuit boards. Other uses include shielding against electromagnetic influence and, in addition to electrical conduction, heat conduction and heat sinking. Furthermore, since an x-y-z conductive medium under z-direction compression has enhanced z-direction conductivity, such a compressed medium can be used where predominant z-direction conductivity is desired, combined with slight x-y-direction conductivity as may be desired, e.g., for dissipation of electrostatic charge. Z-direction conductivity may be made to predominate also by suitable magnetic-field processing, including varying the direction and strength of a magnetic field so as to favor the development of z-direction conductive chains of particles.

Interconnection media having predominant z-direction conductivity and slight x-y conductivity may preferably comprise a large number of relatively small particles in combination with a relatively small number of larger particles. Preferred large-particle diameter is in a range from 10 to 100 micrometers and preferably from 20 to 50 micrometers. Processing in this case may involve, first, x-y magnetic field treatment to establish an x-y conductive network of small particles, followed by z-direction alignment of the larger particles into mutually insulated columns or columnar formations extending the thickness of the medium. See FIGS. 4 and 5 for resulting preferred structures.

Z-direction preferential conductivity may also be achieved by single or "bridging" larger-size particles. In this case, the larger particles may be randomly distributed or else have more uniform x-y distribution as resulting from z-direction magnetic field processing.

Interconnection media of the invention may be used to establish permanent or temporary electrical connections. Permanent connections may take the form of circuitry on a substrate or device component; permanent connections of the invention may also be established between components. Temporary connections are of importance, e.g., in device testing for quality assurance prior to permanent device installation. Temporary as well as permanent connections may involve the use of clamps or other means for applying pressure between components being interconnected. The quality of interconnections may also be enhanced by the use of adhesive matrix materials.

Since interconnection media of the invention are especially suitable for test applications, the following further considerations are presented in this respect. Circuit testing typically requires z-direction electrical continuity across an interconnection medium between contact pads on a test head or test station, and corresponding contact pads on a device, substrate, or board to be tested; required also is sufficient electrical isolation between x-y-adjacent contacts. Moreover, in the interest of preventing potential damage to devices and test equipment due to electrostatic discharge, it has been found that an interconnection medium preferably allows for lateral (x-y) dissipation of electrostatic charge. As described above, interconnection media of the invention can provide for such dissipation via an x-y-directions are suitably chosen. Preferred x-y resistivity is in a range from $10^4$ to $10^{12}$ ohm-centimeters, and preferred ratios of z-direction resistivity to x-y resistivity are in a range from $10^{-7}$ to $10^{-15}$.

EXAMPLE 1

Gold-coated nickel particles having an approximate diameter of 20 micrometers were mixed into an epoxy matrix material in a concentration of approximately 5 percent by volume. The resulting mixture was spread into a layer approximately 75 micrometers thick, and the layer was exposed to x- and y-direction magnetic fields in an alternating fashion, repeated four times. The fields had a strength of approximately 200 oersteds, and each field was applied for approximately 1 second. Both x- and y-fields were gradient fields having a z-direction gradient of approximately 40 oersteds/centimeter; use of such fields resulted in the formation of an x-y-conductive network in a bottom surface region of the layer medium. For subsequent curing of the epoxy, the medium was exposed to an infrared lamp for approximately 30 seconds. Microscopic inspection of the cured medium showed an x-y network of particles as schematically shown in FIGS. 1 and 2, and x-y-direction electrical resistivity of the medium was found to be approximately 0.15 ohm-centimeter. Z-direction resistivity was greater than $10^{10}$ ohm-centimeters.

EXAMPLE 2

Gold-coated nickel particles having an approximate diameter of 40 micrometers, and uncoated nickel particles having an approximate diameter of 2 micrometers were mixed into a liquid silicone elastomer consisting of a 1-to-1 mixture of commercial products GE RTV 615 and GE RTV 630; the 40-micrometer particles were included in a percentage by volume of approximately 3.5, and the 2-micrometer particles in a percentage by volume of approximately 3.0. The mixture was degassed and sheeted out on a flat substrate as a layer having a thickness of approximately 250 micrometers. The layer has subjected first to an x-direction magnetic field of approximately 300 oersteds, and then to a z-direction magnetic field of approximately 650 oersteds, followed by heat curing to form a sheet. Sample sheet size was approximately 20 by 32.5 centimeters. Contact resistance across the thickness of the medium was measured to be in an approximate range from 0.3 to 2 ohms between 625-by-625-micrometer contact pads, and isolation resistance between contact pads spaced approximately 250 micrometers apart was found to be approximately $10^7$ ohms.

EXAMPLE 3

Nickel flakes approximately 1 micrometer thick and 10 micrometers in diameter, coated with silver approximately 1200 Angstroms thick, were mixed in an amount of approximately 6 percent by volume in a liquid silicone elastomer obtained by mixing 1 part GE RTV 615 and 3 parts GE RTV 630. The mixture was degassed, sheeted out as a layer having a thickness of approximately 200 micrometers, exposed to an x-direction magnetic field of approximately 300 oersteds, further exposed to a z-direction field of approximately 600 oersteds, and heat cured. The z-direction resistance between 625-by-625 micrometer contact pads was approximately 4 ohms at a pressure of approximately 10 pounds per square inch, and the in-plane resistance between contact pads spaced approximately 250 micrometers apart was approximately $10^9$ ohms.

What is claimed is:

1. An electrical interconnection medium comprising a body of composite material in the form of a layer or sheet extending in x- and y-directions,
   said composite material comprising first particles in an essentially nonconductive matrix material,
   said first particles at least in part being magnetic and having at least a surface portion which is electrically conducting, and
   said first particles being magnetically aligned into a conductive network, whereby said medium has significant conductivity in said x- and y-directions.

2. The electrical interconnection medium of claim 1, said first particles being present in said medium in an amount in the range from 0.5 to 30 percent by volume.

3. The electrical interconnection medium of claim 1, the diameter of said first particles being in the range from 0.5 to 10 micrometers.

4. The electrical interconnection medium of claim 1, said medium having x-y conductivity less than 1 ohm-centimeter.

5. The electrical interconnection medium of claim 5, said medium having z-direction conductivity less than 1 ohm-centimeter.

6. The electrical interconnection medium of claim 1, said medium having an insulating layer at least at one surface of said layer or sheet.

7. The electrical interconnection medium of claim 1, said medium further comprising second particles,
   said second particles providing for conductivity across the thickness of said layer or sheet.

8. The electrical interconnection medium of claim 7, said second particles at least in part being magnetic, and
   said second particles being magnetically aligned into mutually separated columns.

9. The electrical interconnection medium of claim 7, the diameter of said second particles being in the range from 10 to 100 micrometers.

10. The electrical interconnection medium of claims 7, in-plane resistivity of said layer or sheet being in the range from $10^4$ to $10^{12}$ ohm-centimeters.

11. The electrical interconnection medium of claims 7, the ratio of perpendicular resistivity and in-plane resistivity being in the range from $10^{-7}$ to $10^{-15}$.

12. An article of manufacture comprising an electrical interconnection medium, said medium consisting essentially of a composite material in the form of a layer or sheet extending in x- and y-directions, said composite material comprising first particles in an essentially nonconductive matrix material, said first particles at least in part being magnetic and having at least a surface portion which is electrically conducting, and said first particles being magnetically aligned into a conductive network, whereby said medium has significant conductivity in said x- and y-directions.

13. A method for making a conductive medium, said method comprising a step of forming a layer which extends in x- and y-directions and in which first particles are dispersed in an essentially nonconductive matrix material, said first particles at least in part being magnetic and having at least a surface portion which is electrically conducting, and a step of magnetically aligning said first particles into a conductive network, whereby said medium has significant conductivity in said x- and y-directions.

14. The method of claim 13, said method further comprising a step of dispersing second particles in said nonconductive matrix material, said second particles having at least a surface portion which is electrically conducting, and said second particles having a diameter which is significantly greater than the diameter of said first particles.

15. The method of claim 14, said second particles at least in part being magnetic, and said method comprising magnetically aligning said second particles into columns extending across the thickness of said medium.

* * * * *

UNITED STATES PATENT AND TRADEMARK OFFICE
CERTIFICATE OF CORRECTION

PATENT NO. : 4,923,739

DATED : May 8, 1990

INVENTOR(S) : S. Jin, W. R. Lambert, R. C. Moore, J. J. Mottine, Jr., R. C. Sherwood, T. H. Tiefel It is certified that error appears in the above-identified patent and that said Letters Patent is hereby corrected as shown below:

Column 5, line 28 "an x-y-directions" should read --an x-y-conductive network of particles provided that resistivities in z- and x-y-directions--

Column 6, line 1 "has" should read --was--

IN THE CLAIMS:

Column 7, line 1 "claims" should read --claim--

Column 7, line 4 "claims" should read -- claim--

Signed and Sealed this

Eighth Day of October, 1991

Attest:

HARRY F. MANBECK, JR.

Attesting Officer

Commissioner of Patents and Trademarks